United States Patent [19]

Yen

[11] 4,195,258
[45] Mar. 25, 1980

[54] LOGIC ANALYZER FOR INTEGRATED CIRCUITS, MICROCOMPUTERS, AND THE LIKE

[75] Inventor: Yao T. Yen, Cupertino, Calif.

[73] Assignee: Intel Corporation, Santa Clara, Calif.

[21] Appl. No.: 773,435

[22] Filed: Mar. 1, 1977

[51] Int. Cl.² ............................................. G01R 15/12
[52] U.S. Cl. ............................ 324/73 AT; 324/158 F
[58] Field of Search ............ 324/73 R, 73 AT, 158 F, 324/22, 23; 235/153 AC, 153 AM

[56] References Cited

U.S. PATENT DOCUMENTS

| | | | |
|---|---|---|---|
| 2,002,425 | 5/1935 | Williams | 324/22 |
| 3,418,573 | 12/1968 | Alford et al. | 324/73 AT |
| 3,751,649 | 8/1973 | Hart, Jr. | 235/153 AC |
| 3,764,995 | 10/1973 | Helf, Jr. et al. | 324/73 X |
| 3,831,149 | 8/1974 | Job | 324/73 R X |
| 3,848,188 | 11/1974 | Ardezzone et al. | 324/73 AT |
| 3,882,386 | 5/1975 | Vinsani | 324/73 R |

Primary Examiner—Michael J. Tokar
Attorney, Agent, or Firm—Blakely, Sokoloff, Taylor & Zafman

[57] ABSTRACT

An improvement for a logic state analyzer which is used for testing or analyzing microcomputers employing different microprocessors or other integrated circuits such as memories. A universal clip connector is coupled to the connector pins of the integrated circuit package. The analyzer's memory stores the pin-signal relationship for each integrated circuit which engages the clip connector. A selection means is employed with this memory to select the signals required by the analyzer. The analyzer is then able, by way of example, to select the data bits on different microprocessors even though these bits are coupled to different pins in each processor. In this manner, microcomputers employing different microprocessors may be tested or analyzed without probe or lead changes, or other hardware changes.

12 Claims, 2 Drawing Figures

LOGIC ANALYZER FOR INTEGRATED CIRCUITS, MICROCOMPUTERS, AND THE LIKE

BACKGROUND OF THE INVENTION

1. Field of the Invention

The invention relates to the field of analyzers or testers for testing circuits, particularly integrated circuits.

2. Prior Art

Analyzers and testers have been developed to test integrated circuits such as random-access memories (RAMs), read-only memories (ROMs), and other circuits which employ a plurality of separately packaged integrated circuits such as microcomputers. Logic analyzers have emerged for this purpose and are commercially available from a number of companies. For a general description of such analyzers, see "The Logic Analyzer: A Computer Troubleshooting Tool" by Robin, *Computer Design,* March 1976 beginning on page 89; *Logic Analyzer Primer* published by Tektronix, Inc., copyrighted 1976; and, *The Logic Analyzer,* Application Note 167-1 published by Hewlett-Packard, Inc. These analyzers most often store and display data, and unlike many other displays, they employ trigger pulses to terminate a particular sequence rather than for initiating the sequence.

Logic Analyzers may be employed to display input or output data bits, address bits, instruction bits, or the like. Multiple probes are used to couple the integrated circuit signal paths to the analyzer. If input data bits are to be displayed, these probes are connected to the appropriate pins of the integrated circuit package. If address bits are to be displayed, the probes are manually moved to the correct pins. Clip connectors, or the like, are not suitable for this application since the pin-signal configuration varies substantially from circuit-to-circuit. That is, by way of example, on one integrated circuit package the output data may be coupled to pins 1 through 8 of a dual in-line package, while on another memory the output data bits may be on other pins. Thus, the multiple probes must be manually moved for each of the circuits, or other lead changes must be made.

With the described improved analyzer, the pin-signal configuration of each circuit which is tested or analyzed is stored in a memory, referred to as a "personality table". A universal clip connector is used to interconnect the integrated circuit package with the analyzer. Selection means within the analyzer selects the appropriate signals from the connector based on the pin-signal data stored in the personality table. This eliminates the multiple probes often used in prior art analyzers.

SUMMARY OF THE INVENTION

An improvement is described in an apparatus employed for testing or analyzing a plurality of different integrated circuits. The improved apparatus is particularly useful where each of the circuits includes a connector and where predetermined signal paths of the circuits are coupled to different contacts on these connectors. The improvement allows the unscrambling of the predetermined signal paths without requiring probe changes, or the like. The analyzer's memory stores data for each of the circuits which are to be tested analyzed. This data represents the interrelationships between the predetermined signal paths of the circuits and the contacts of the connectors. The analyzer also includes selection means which is coupled to both the memory and the contacts of the connector for selecting these predetermined signal paths as a function of the data stored in the memory. In this manner, the predetermined signal paths may be readily selected for testing or analyzing without requiring probe changes, or the like, often required in prior art analyzers.

DETAILED DESCRIPTION OF THE INVENTION

Figure 2:
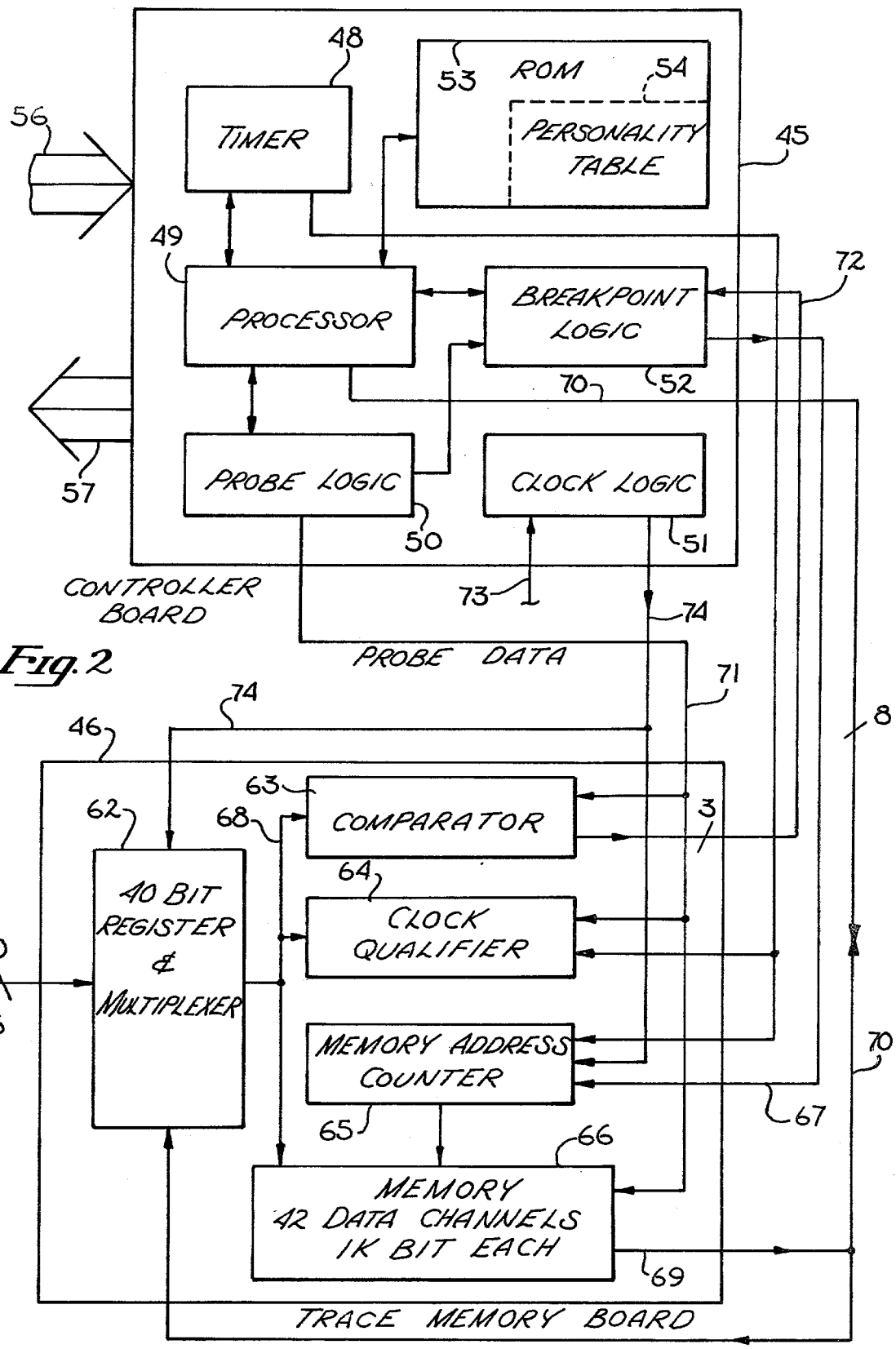
FIG. 2 is a block diagram which illustrates the improvement of FIG. 1 when included in a logic state analyzer.

An apparatus is described which is particularly suitable for inclusion within an analyzer employed for analyzing or testing integrated circuits and circuits which included a plurality of integrated circuits such as microcomputers. The apparatus permits the selection of predetermined signals or signal paths such as data bits, address bits, or the like, from a number of different integrated circuit packages without multiple probes which typically require manul unscrambling for each integrated circuit package. In the following description well-known circuits have been shown in block diagram form. In the case of FIG. 2 the improvement of this invention is described in conjunction with portions of a logic state analyzer which includes many other features. In order not to obscure the inventive concepts of this patent in unnecessary detail, these other features and well-known circuits have not been described in detail.

Figure 1:
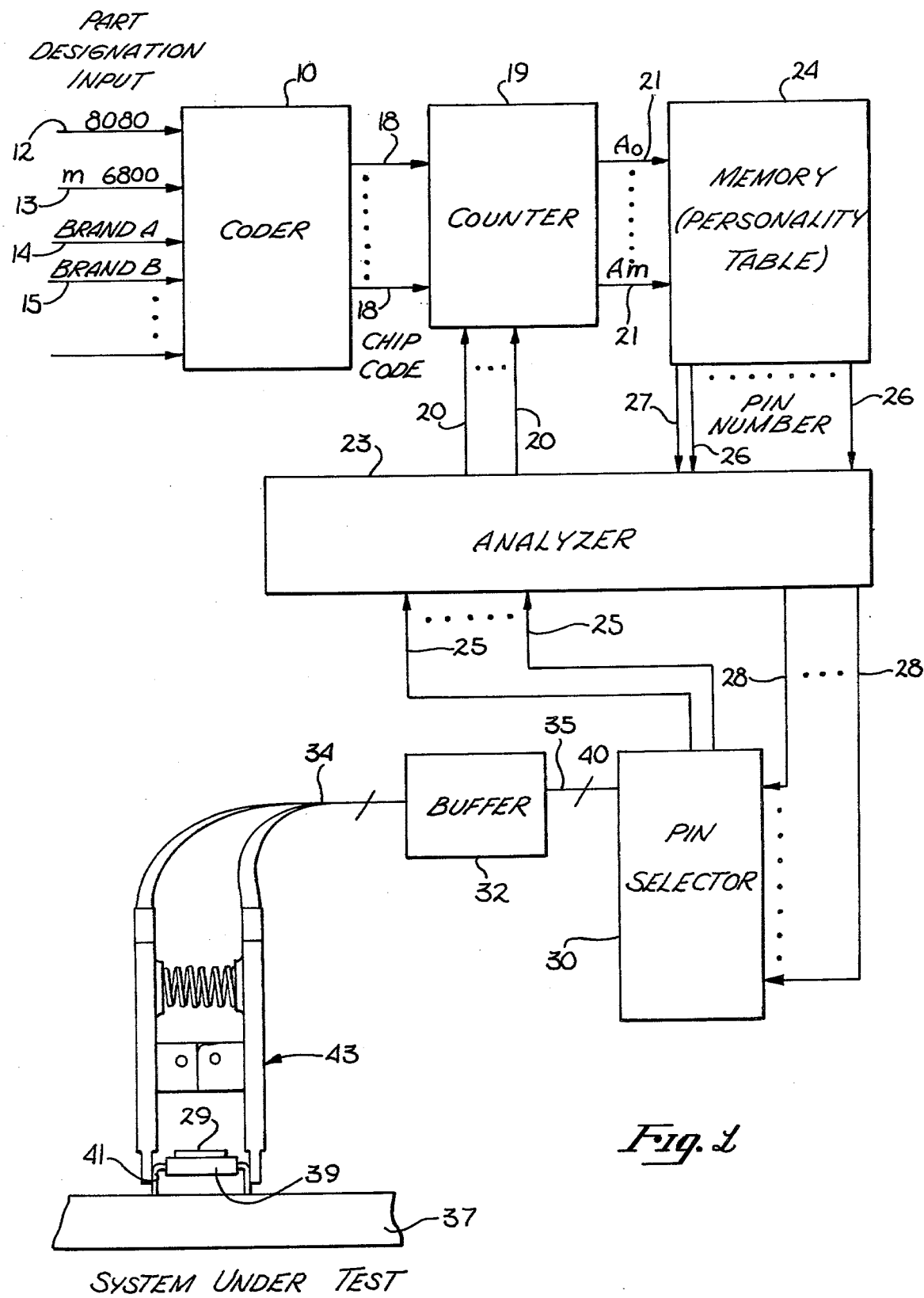
FIG. 1 is a block diagram of the present invention illustrating the means employed to select signal or signal paths from a plurality of different integrated circuits.

Referring now to FIG. 1, an integrated circuit 29 is shown in a dual in-line integrated circuit package 39. The pins 41 of this package are electrically coupled to a printed circuit board 37. It is assumed that the integrated circuit 29, alone, or in conjunction with other circuitry which may be part of board 37 is being tested or analyzed by analyzer 23. The analyzer 23 may employ well-known circuits. In the presently preferred embodiment, the analyzer is employed for testing microcomputers, thus the following description is oriented towards microcomputers. However, it will be obvious to one skilled in the art that the inventive concepts may be employed for testing other circuits such as memories.

The analyzer 23, in the presently preferred embodiment, is adaptable for receiving signals from a plurality of different microprocessors. For example, the integrated circuit 29 may be any one of a number of commercially available microprocessors such as an "8080" or a "M6800" processor. These processors, and others, are packaged in dual in-line packages such as package 39. The pin-signal configuration is often different for each microprocessor. That is, for one microprocessor instruction bits may be coupled to pins 1 through 8, while in another microprocessor the instruction bits may be coupled to other pins. If the instruction bits are to be sensed by the analyzer, probes must be connected to the appropriate pins for each processor.

With the improvement of FIG. 1, separate probes are not employed but rather a universal clip connector such as connector 43 is coupled to the pins 41 of package 39. The pins of this package are thus coupled to leads of a cable 34. The pin-lead relationship is the same for each circuit to be tested. That is, pin one of each package will be coupled to the same lead of cable 34, and so on, for each package. In the presently preferred embodiment, the forty pins of package 39 are coupled by the cable 34 to a plurality of buffers 32. The buffers 32 buffer the signals sensed by the leads of cable 34 in an ordinary manner. The output of the buffers 32, cable 35, is coupled to a pin selector means 30.

The pin selector means 30 is a control means for selecting one or more of the leads of cable 35 and for coupling the signals on these leads to the logic analyzer 23 through line or lines 25. The selection of the leads of cable 35 is controlled by the signals received by the pin selector 30 on lines 28. The pin selector 30 thus may be an ordinary switching means which decodes the signals on lines 28 so as to complete the appropriate path between cable 35 and lines 25. As will be seen in conjunction with FIG. 2, the pin selector 30 may include a memory which stores signals received from the buffers 32. In this case the signals on lines 28 are address signals employed for accessing this memory.

For the embodiment of FIG. 1, a memory 24 is employed to store data representing the relationship between the pin numbers and the signals coupled to these pins for each integrated circuit such as circuit 29. This pin-signal relationship would indicate, by way of example, that for a "Brand A" circuit the instruction bits are coupled to pins 1 through 8, the data bits are coupled to pins 20 through 28, etc. This data establishes a personality table for the different integrated circuits which are to be tested or analyzed by the logic analyzer 23.

The memory 24 may be an ordinary read-only memory. As will be described in conjunction with FIG. 2, in the presently preferred embodiment, the personality table is part of a larger memory employed by the logic analyzer. A random-access memory (RAM) may be employed for the personality table. In this event, the operator may insert (such as through a keyboard) the pin-signal relationship for storage in the RAM.

The selection of the data within the personality table is made by the address bits $A_0$ through $A_m$ which are coupled to the memory 24 on lines 21. These address bits are generated by a counter 19. The counter 19 may be an ordinary digital counter commonly employed for accessing information in memories. The counter for the described embodiment receives signals from coder 10 on lines 18 and also from the logic analyzer 23 on lines 20.

The coder 10 may be an ordinary coding means for receiving a plurality of signals and for providing predetermind coded signals. The coder 10 receives an input which identifies the particular integrated circuit which is to be coupled to the clip connector 43. For example, a signal may be applied to coder 10 on line 12 to indicate that an 8080 microprocessor is to be analyzed. Similarly, a signal may be applied to coder 10 on line 13 to indicate that an M6800 microprocessor is to be tested; or a Brand A circuit (line 14), Brand B circuit (line 15) etc. These inputs to coder 10 may be manual inputs selected by an operator. Coder 10 provides the predetermined output signals on lines 18 to counter 19 which signal forms part of an address for memory 24. The signals on line 18, for example, may select the section of the memory 24 which contains the pin-signal configuration for an 8080 microprocessor.

The logic analyzer 23 provides signals on lines 20 which represent the information which is to be examined by the analyzer 23. Thus, if address bits of the integrated circuit 29 are to be examined, a predetermined signal is applied to lines 20. If on the other hand, data bits are to be examined a different predetermined signal is applied to the counter 19 through lines 20. The signal applied to counter 19 need not be different for each integrated circuit. The signals on lines 18 and lines 20 provide the counter 19 with a single address, which address is communicated to the memory 24 on lines 21. The data stored at that address is communicated to the analyzer 23. This data (or at least a portion of it) is communicated to the pin selector 30 on lines 28 and is employed by the pin selector to select a particular lead of cable 35. This lead may then be coupled to lines 25 by the pin selector 30.

Assume that a "Brand A" circuit has been coupled to the universal clip connector 43 and that an operator has furnished a signal to coder 10 on line 14. If the logic analyzer is to display data bits, the analyzer 23 couples a signal to counter 19 on line 20 indicating that data bits are to be coupled to the analyzer 23 on lines 25. Lines 18 contain the address for the "Brand A" section of the personality table. The partial address on lines 20 identify the portion of this section which stores the data bit pin numbers. Together the signals on 18 and 20 access data at a single location in the memory. This location contains the pin number of the first data bit for the "Brand A" part. By way of example, assume pin 20 contains the first data bit and that lines 26 receive the digital number 00010100. The pin selector upon receiving this digital number by way of the analyzer 23 selects the lead of cable 35 coupled to pin 20 and coupled this lead to the analyzer 23. Then the counter 19 increments (or decrements) the address to the next location within the memory 24. This location contains the pin number for the second data bit. Assuming pin 18 is the source of the second data bit, the binary number 00010010 is coupled to the pin selector. Again the counter increments and the next pin is selected, and so on.

In the presently preferred embodiment, the memory 24 provides (8 bits) for each address. Eight bits are not required to designate pins 1 through 40 on an integrated circuit package. Eight bits are available, however, since the memory is employed for other purposes. The bits not required to designate a pin number may be employed for other purposes. Specifically, continuing with the above example, assume that the "Brand A" circuit has eight data bit lines and that the eighth data bit is coupled to pin 40. When the counter 19 communicates the eighth address to the memory 24, the memory communicates the binary signal 10101000 to the analyzer 23. The last six binary digits of this number designate pin 40. The most significant binary digit is communicated on line 27 to the analyzer 23. This signal indicates that the last data bit has been selected. Thus the counter continues to count as long as it receives a binary zero at the most significant binary bit on line 27. When the eight or last pin has been selected the counter and the analyzer both receive a signal indicating that the last data bit has been selected.

Referring to FIG. 2, two circuit boards of the logic state analyzer of the presently preferred embodiment are illustrated. The remainder of the logic analyzer may be constructed employing well-known circuitry. The controller board 45 is illustrated coupled to the remainder of the analyzer through lines 56 and 57. The trace memory board 46 is coupled to the integrated circuit under test through the leads of cable 35, which cable is also illustrated in FIG. 1. The cable 35 while not illustrated in FIG. 2, is coupled to the circuit being tested or analyzed through a buffer and a universal clip connector.

In FIG. 2 the leads of cable 35 are coupled to a forty bit register and multiplexer 62 which may be an ordinary register and multiplexing means. The register and multiplexer 62 is also coupled to the eight leads of line 70. The register and multiplexer 62 couples the signals on either cable 35 or line 70 to the comparator 63, clock qualifier 64, or memory 66 on line 68. The register and multiplexer receives clock signals on line 74 from a clock logic means 51. (Note numerous control signal paths, well-known in the art, have not been illustrated in FIG. 2).

The comparator 63 is an ordinary comparator means for comparing digital signals. This means receives these signals on line 68. In the presently preferred embodiment, comparator 63 comprises three data comparison registers of forty-two bits each.

The clock qualifier 64 is an ordinary clock qualifying means employed in logic analyzers. Qualifier 64 allows the selective sensing of signals for storage in the memory 66. For example, it may be necessary for a test to store data in memory 66 only when a particular clock signal is high.

The memory address counter 65 is an ordinary memory address counter means for providing address signals to the memory 66. In the presently preferred embodiment, memory 66 is a random-access memory consisting of forty-two data channels with a capacity of 1024 bits per channel.

The control function of the analyzer is performed primarily by the controller board 45. This board includes a processor 49 for controlling the analyzer. In the presently preferred embodiment, this processor comprises a commercially available 8080 microprocessor. A timing "clip" 48 is employed with the processor; this chip may be a commercially available part such as Part Number 8253. The program employed for analyzing and testing is stored within the read-only memory 53. This 8k (bytes) memory, in the presently preferred embodiment, also includes the personality table 54, that is, the pin-signal relationship for each of the circuits which are to be analyzed or tested. Known probe logic means 50 are employed to provide probe data and logic signals on line 71 to the comparator 63, clock qualifier 64, and the memory 66. Clock logic means 61 provides clocking signals on line 74 particularly for the memory address counter 65 and for the register and multiplexer 62. This clock logic means may be controlled by timing signals received on line 73 from the system under test. The processor 49 provides data bits on line 70 to the register and multiplexer 62 and also receives data from the memory 66 on this line. Breakpoint logic means 52 provides the breakpoint logic employed by the analyzer. This means provides signals to the counter 65 on line 67 and to other circuits of the analyzer. The comparator 63 provides signals to the breakpoint logic means 52 on lines 72 to indicate a "match".

The circuit of FIG. 2 operates in a well-known manner with the remainder of the analyzer for purposes of analyzing and testing. However, incorporated within this analyzer are the functions described in conjunction with FIG. 1. The coding function of the coder 10 of FIG. 1 is performed by means not shown in FIG. 2. The counting function of counter 19, and the function performed by the register 31 are performed by means not shown in FIG. 2 and by the processor 49 of FIG. 2. The pin selection function of pin selector 30 of FIG. 1 is performed in part by the memory address counter 65 and the memory 66.

In the embodiment of FIG. 2 the data from cable 35 is first stored within the memory 66. Then the desired signals are selected from this memory. For example, the personality table 54 may indicate that data channels 10 through 18 contain instruction bits which are to be analyzed. These bits, by way of example, may then be coupled through line 70 through the register and multiplexer 62 to the comparator 63. There they may be compared with other signals received on cable 35. In any event, the personality table 54 allows the appropriate data channels to be selected from memory 66 in the same manner as the appropriate leads of cable 35 were selected and coupled to lines 25 of FIG. 1.

Thus an improvement in a circuit analyzer has been described which permits the analyzer to be employed with a plurality of different circuits, each of which has a unique pin-signal configuration. A stored personality table allows the analyzer to select any desired signal or signal path without manually unscrambling the coupling probes to integrated circuit packages.

I claim:

1. In an apparatus for testing or analyzing a plurality of circuits where each of said circuits includes a single connector means and where predetermined signal paths of said circuits are coupled to different contacts of said single connector means, a improvement for selecting said predetermined signal paths comprising;
    memory means for storing data for each of said circuits representative of said coupling between said predetermined signal paths of said circuits and said different contacts; and
    selection means, coupled to said memory means and said contacts of said connector means, for selecting said predetermined signal paths as a function of said data stored in said memory;
    whereby predetermined signal for each of said circuits may be selected for testing or analyzing without requiring the manual unscrambling of probes.

2. The apparatus defined by claim 1 wherein said circuits comprise integrated circuits and said connector means each comprise integrated circuit packages.

3. The apparatus defined by claim 2 wherein said selection means is coupled to said integrated circuit packages by a clip connector which engages pins of said packages.

4. The appratus defined by claim 3 wherein said memory means comprises a read-only memory.

5. The apparatus defined by claim 1 wherein a second memory means is employed for storing electrical signals from said connector means such that signals from said circuits may be stored in said second memory and predetermined signals selected from said second memory by said selection means.

6. In an apparatus for testing or analyzing a plurality of different circuits wherein each of said different circuits couples different predetermined signals to contacts of said circuit, a improvement for tracing said predetermined signals comprising:
    a single connector for engaging said contacts in said circuit;
    memory means for storing information representative of the relationship between said predetermined signals and said contacts for each of said different circuits;
    selection means, coupled to said memory means and said connector for selecting said predetermined signals as a function of said information stored in said memory means;

whereby said predetermined signals may be traced for said different circuits without probe changes.

7. The apparatus defined by claim 6 wherein said connector comprises a clip connector and said contacts comprise pins of an integrated circuit package.

8. The apparatus defined by claim 7 wherein a second memory means for storing data is coupled between said connector and said selection means such that said selection means selects said predetermined signal for said second memory means.

9. In a logic analyzer for testing or analyzing a plurality of microcomputers each of which includes a different microprocessor disposed in an integrated circuit package, wherein predetermined signals such as instruction signals or data signals are coupled to different pins of said package for said different microprocessors; an improvement for selecting said predetermined signals for said different microprocessors without probe changes comprising:

a single connector for engaging said pins;

first memory means for storing information representing the coupling between said predetermined signals and said pins for each of said different microprocessors;

control means for selecting said predetermined signals as a function of said information stored in said first memory, coupled to said memory and said connector;

whereby predetermined signals may be selected without probe changes.

10. The improvement defined by claim 9 wherein said connector comprises a clip connector.

11. The improvement defined by claim 10 wherein said clip connector is coupled through a buffer to second memory means for storing signals from said pins.

12. The improvement defined by claim 11 wherein data stored in said second memory is selectable by said control means.

* * * * *